US012620988B2

(12) United States Patent
Wang et al.

(10) Patent No.: US 12,620,988 B2
(45) Date of Patent: May 5, 2026

(54) GATE VOLTAGE BOOTSTRAP SWITCHING CIRCUIT

(71) Applicant: IPGoal Microelectronics (Sichuan) Co., Ltd., Sichuan (CN)

(72) Inventors: Lun Wang, Chengdu (CN); Xiangyang Guo, Chengdu (CN)

(73) Assignee: IPGOAL MICROELECTRONICS (SICHUAN) CO., LTD., Sichuan (CN)

( * ) Notice: Subject to any disclaimer, the term of this patent is extended or adjusted under 35 U.S.C. 154(b) by 25 days.

(21) Appl. No.: 18/981,567

(22) Filed: Dec. 15, 2024

(65) Prior Publication Data

US 2025/0112635 A1 Apr. 3, 2025

(30) Foreign Application Priority Data

May 31, 2024 (CN) .......................... 202410695617.3

(51) Int. Cl.
*H03K 17/687* (2006.01)
*H03M 1/46* (2006.01)
(52) U.S. Cl.
CPC ............ *H03K 17/687* (2013.01); *H03M 1/46* (2013.01); *H03M 1/468* (2013.01)
(58) Field of Classification Search
CPC ... H03K 17/687; H03K 17/6872; H03M 1/46; H03M 1/468

USPC .......................................................... 327/390
See application file for complete search history.

(56) References Cited

U.S. PATENT DOCUMENTS

2023/0221747 A1* 7/2023 Lee .......................... G05F 1/575
341/161

FOREIGN PATENT DOCUMENTS

CN          106505979 A       3/2017
CN          218976674 U       5/2023

* cited by examiner

*Primary Examiner* — William Hernandez
(74) *Attorney, Agent, or Firm* — SHIMOKAJI IP

(57) ABSTRACT

A gate voltage bootstrap switching circuit includes an LDO, a first MOS transistor, a second MOS transistor, a third MOS transistor, and a voltage control unit. The LDO has an inverting input terminal of connected to its output terminal. Drain of the first MOS transistor and source of the third MOS transistor are connected to the output terminal, source of the first MOS transistor is connected to drain of the second MOS transistor, and source of the second MOS transistor is connected to drain of the third MOS transistor. Capacitor arrays are connected. The voltage control unit is connected to gates of the first, second, and third MOS transistors to input an external power supply voltage as a gate-source voltage to the MOS transistors. The circuit eliminates the non-linearity of the impedance of the switch MOS transistors and improves the conversion speed of the ADC.

7 Claims, 2 Drawing Sheets

GATE VOLTAGE BOOTSTRAP SWITCHING CIRCUIT

FIELD OF THE INVENTION

The present invention relates to the field of integrated circuits, and more specifically to a gate voltage bootstrap switching circuit.

BACKGROUND OF THE INVENTION

In the design of the successive approximation analog-to-digital converter (SAR ADC), the design of the internal digital-to-analog converter (DAC) is crucial. The DAC is primarily used to sample the input signal with low error and generate two voltages for comparison, which are then compared by a comparator to obtain a digital level for analog signal conversion. The part of the circuit that samples the input signal determines the accuracy of the input signal. If the sampling switch circuit is not sufficiently good, it may ultimately lead to a decrease in the effective bits of the digital signal output by the ADC.

There are many common sampling structures for SAR ADCs, including traditional switch sampling structures, low-power capacitive switch sampling structures, and monotonic switch sampling structures. Currently, many SAR ADCs on the market with resolutions below 14 bits and sampling rates below 5M use traditional switch sampling structures, for example as shown the circuit structure of a 4-bit SAR ADC in FIG. 1. In the structure shown in FIG. 1, during sampling, switch S1 is closed, and the voltages Vpos and Vneg are the same. Switch S1 is a conventional complementary switch structure (as shown in FIG. 2), and the on-resistance Ron of switch S1 is given by:

$$Ron = RonN//RonP.$$

It's seen that, the N-type MOS switch parallel to the P-type MOS switch (as shown in FIG. 2, RonN is the equivalent resistance value of the N-type MOS transistor, and RonP is the equivalent resistance value of the P-type MOS transistor). It's calculated that, $$Ron = \cfrac{1}{\mu_n C_{ox}\left(\cfrac{W}{L}\right)_N (VDD - Vin - Vthn)} // \cfrac{1}{\mu_p C_{ox}\left(\cfrac{W}{L}\right)_P (Vin + Vthp)},$$

where the parameters $\mu n$, $\mu_p$, $C_{ox}$ respectively represent a carrier mobility of the N-type MOS transistor, a carrier mobility of the P-type MOS transistor, and an unit capacitance of the gate oxide layer. VDD (not shown in the figure) represents a supply voltage, Vin represents a voltage of Vpos and Vneg during sampling, and Vthn and Vthp represents threshold voltages for turning on the N-type MOS transistor and the P-type MOS transistor, respectively.

In the above quotation, since the voltage Vth is actually a function of the voltage Vin, the resistance Ron exhibits non-linearity, meaning that the resistance Ron changes with variations in voltage Vin.

Furthermore, considering the non-linearity caused by charge injection, the switch S1 in FIG. 1 uses the transmission gate form switch (MOS switch) shown in FIG. 2. In this structure, the sizes of the P-type and N-type MOS transistors are the same to eliminate charge injection. Additionally, the MOS transistors require low resistance to not affect the sampling time. CT and CTN are control signals with the same frequency but opposite phases.

In the above complementary switch structure, differential and single-ended configurations cannot share the same capacitor array. The capacitance required for single-ended mode is double that for differential mode, leading to increased capacitance values and areas, which in turn raises the power consumption and production costs of the overall circuit.

Therefore, there is a need to provide an improved gate voltage bootstrap switching circuit to overcome the aforementioned defects in common mode voltage sampling structures.

SUMMARY OF THE INVENTION

The purpose of the present invention is to provide a gate voltage bootstrap switching circuit, which eliminates the non-linearity of the impedance of the switch MOS transistors and improves the conversion speed of the ADC.

To achieve the above objectives, the present invention provides a gate voltage bootstrap switching circuit, adapted for a common mode voltage sampling structure, and the circuit includes a low dropout regulator (LDO), a first MOS transistor, a second MOS transistor, a third MOS transistor, and a voltage control unit. A non-inverting input terminal of the LDO is connected to an external reference voltage, an inverting input terminal of the LDO is connected to an output terminal of the LDO which outputs a common mode voltage; a drain of the first MOS transistor and a source of the third MOS transistor are both connected to the output terminal of the LDO, a source of the first MOS transistor is connected to a drain of the second MOS transistor, and a source of the second MOS transistor is connected to a drain of the third MOS transistor; two external capacitor arrays are connected to the source and drain of the second MOS transistor, respectively; the voltage control unit is connected to an external power supply, and further connected to gates of the first, second, and third MOS transistors respectively to input a voltage of the external power supply as a gate-source voltage to the first, second, and third MOS transistors.

As a preferable embodiment, the first, second, and third MOS transistors are all N-type MOS transistors.

As a preferable embodiment, a width-to-length ratio of the first, second, and third MOS transistors is greater than 100.

As a preferable embodiment, the voltage control unit comprises a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, and a first capacitor; a gate of the fourth MOS transistor, a gate of the sixth MOS transistor, a source of the fifth MOS transistor, and a drain of the ninth MOS transistor are all connected to a gate of the second MOS transistor; a drain of the fourth MOS transistor is connected to the output terminal of the LDO, a source of the fourth MOS transistor is connected to a drain of the twelfth MOS transistor, a source of the eighth MOS transistor, and one end of the first capacitor; a drain of the fifth MOS transistor is connected to the other end of the first capacitor and a drain of the sixth MOS transistor; a gate of the fifth MOS transistor is connected to a drain of the eighth MOS transistor and a source of the seventh MOS transistor, a source of the ninth MOS transistor is connected to a source of the tenth MOS transistor and a drain of the eleventh MOS transistor, and the sources of the ninth MOS transistor and the tenth MOS transistor are both grounded; the external power supply is connected to a source of the sixth MOS transistor, a drain of the seventh MOS transistor, a gate of the ninth MOS transistor, and a drain of the tenth MOS transistor; a first external clock signal is input to the gates of the tenth MOS transistor, the eleventh MOS transistor, and the twelfth MOS transistor, respectively; and a second external clock signal is input to the gates of the seventh MOS transistor and the eighth MOS transistor, respectively.

As a preferable embodiment, the first external clock signal and the second external clock signal have a same frequency and opposite phases.

As a preferable embodiment, a width-to-length ratio of the fourth MOS transistor is greater than 60.

As a preferable embodiment, a capacitance value of the first capacitor is greater than 1 pF.

In comparison with the prior art, the voltage control unit of the gate voltage bootstrap switching circuit of the present invention connects to the gates of the first MOS transistor, the second MOS transistor, and the third MOS transistor, thus providing the same high gate-source voltage to these transistors, thereby eliminating the issue of impedance non-linearity caused by different inputs in the various MOS transistors. This also minimizes the impedance of the MOS transistors, enhancing the conversion speed of the ADC.

BRIEF DESCRIPTION OF THE DRAWINGS

The accompanying drawings facilitate an understanding of the various embodiments according to the present invention. In such drawings.

DETAILED DESCRIPTION OF ILLUSTRATED EMBODIMENTS

Figure 1:
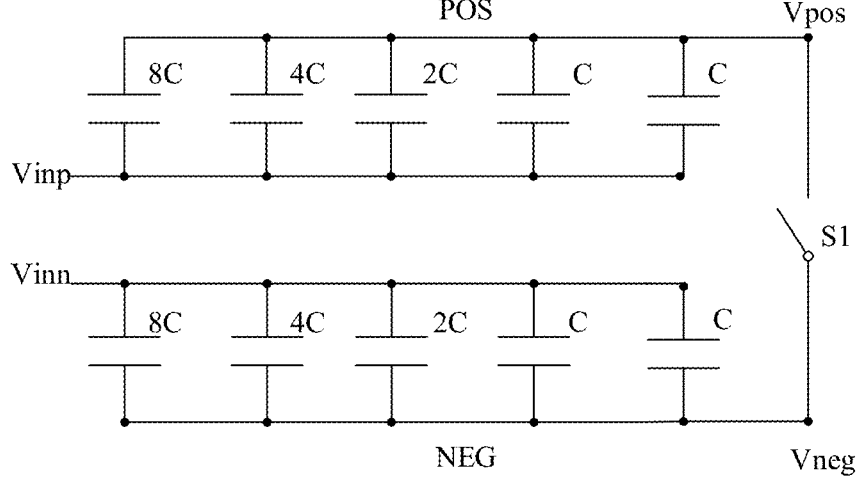
FIG. 1 is a schematic diagram of a complementary switch circuit combined with capacitor arrays in the prior art.
Figure 2:
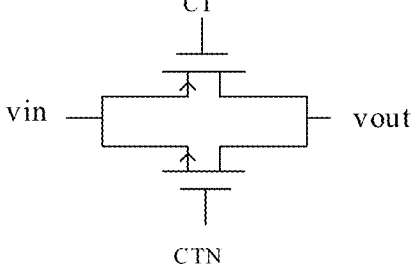
FIG. 2 is a schematic diagram of the switch structure in the circuit shown in FIG. 1.

Referring to the accompanying drawings, the embodiments of the present invention are described. Similar reference numerals in the drawings represent similar elements. As described above, the present invention provides a gate voltage bootstrap switching circuit that eliminates the non-linearity of the impedance of MOS transistors and improves the conversion speed of the ADC.

Figure 3:
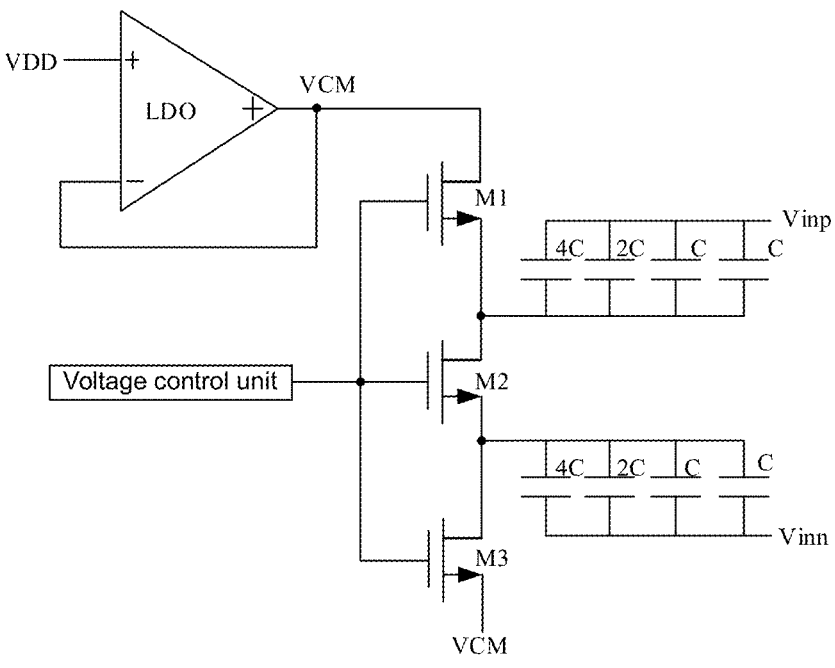
FIG. 3 is a schematic diagram of the gate voltage bootstrap switching circuit combined with capacitor arrays according to the present invention.

Referring to FIG. 3, a gate voltage bootstrap switching circuit combined with capacitor arrays according to the present invention is illustrated. As shown, the gate voltage bootstrap switching circuit of the present invention is mainly used for common mode voltage sampling structures, and includes an LDO, a first MOS transistor M1, a second MOS transistor M2, a third MOS transistor M3, and a voltage control unit. An external reference voltage VDD is input to the non-inverting input terminal of the LDO, the inverting input terminal of the LDO is connected to its output terminal, and the output terminal of the LDO outputs a common mode voltage VCM. The drain of the first MOS transistor M1 and the source of the third MOS transistor M3 are both connected to the output terminal of the LDO, allowing the common mode voltage VCM to be input to the drain of the first MOS transistor M1 and the source of the third MOS transistor M3. The source of the first MOS transistor M1 is connected to the drain of the second MOS transistor M2, and the source of the second MOS transistor M2 is connected to the drain of the third MOS transistor. Two sets of external capacitor arrays are respectively connected to the source and drain of the second MOS transistor M2, thereby forming a complete common mode voltage sampling structure (as shown in FIG. 3). The voltage control unit is connected to an external power supply AVD, and the voltage control unit is connected to the gates of the first MOS transistor M1, the second MOS transistor M2, and the third MOS transistor M3, thereby providing the external power supply voltage AVD as the gate-source voltage to the first MOS transistor M1, the second MOS transistor M2, and the third MOS transistor M3. As mentioned, the gate voltage bootstrap switching circuit of the present invention provides the power supply voltage AVD as the gate-source voltage to the first MOS transistor M1, the second MOS transistor M2, and the third MOS transistor M3 through the voltage control unit, so that the three MOS transistors (first MOS transistor M1, second MOS transistor M2, third MOS transistor M3) have sufficient identical gate-source voltages, thereby significantly reducing the impedance of the three MOS transistors to nearly the minimum value, which not only improves the conversion speed of the ADC but also eliminates the non-linearity issues during the sampling process.

As a preferred embodiment of the present invention, the first MOS transistor M1, the second MOS transistor M2, and the third MOS transistor M3 are all N-type MOS transistors, ensuring that the outputs and corresponding voltages of the three MOS transistors are the same. Furthermore, in the present invention, the gate voltage bootstrap switching circuit typically needs to provide a bandwidth of over 5M; hence, the dimensions of the first MOS transistor M1, the second MOS transistor M2, and the third MOS transistor M3 need to be sufficiently large to provide a wider bandwidth. Therefore, in the present invention, the width-to-length ratio of the first MOS transistor M1, the second MOS transistor M2, and the third MOS transistor M3 is set to be greater than 100. The specific value of the width-to-length ratio can be determined according to the specific requirements for bandwidth in the actual applications. As mentioned, the gate voltage bootstrap switching circuit of the present invention, when used in conjunction with the capacitor arrays, uses the same set of capacitors for single-ended and differential inputs, therefore there is no need to increase the capacitance of the entire capacitor array during use, which does not increase the capacitance value and capacitance area, thereby reducing the overall power consumption and production costs of the circuit.

Figure 4:
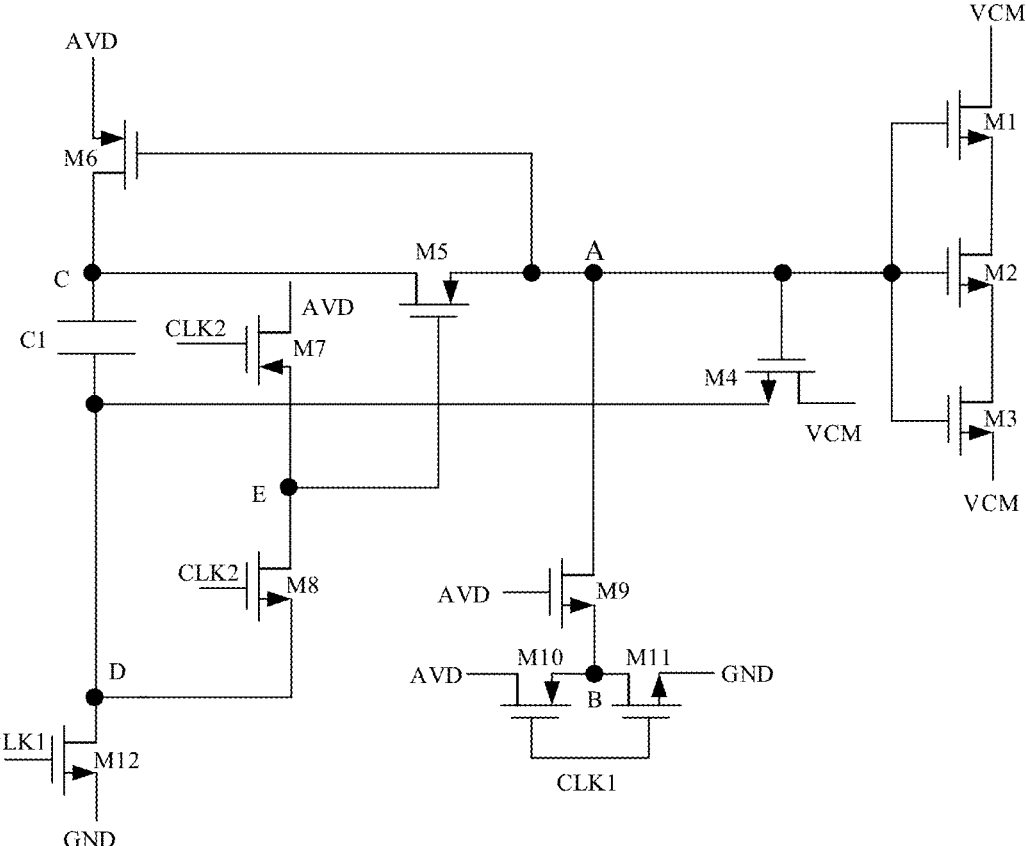
FIG. 4 is a schematic diagram of the voltage control unit in the circuit shown in FIG. 3.

Referring to FIG. 4 again, in the present invention, the voltage control unit includes a fourth MOS transistor M4, a fifth MOS transistor M5, a sixth MOS transistor M6, a seventh MOS transistor M7, an eighth MOS transistor M8, a ninth MOS transistor M9, a tenth MOS transistor M10, an eleventh MOS transistor M11, a twelfth MOS transistor M12, and a first capacitor C1. The gate of the fourth MOS transistor M4, the gate of the sixth MOS transistor M6, the source of the fifth MOS transistor M5, and the drain of the ninth MOS transistor M9 are all connected to the gate of the second MOS transistor M2, forming node A, thereby inputting the voltage generated by the voltage control unit into the gates of the first MOS transistor M1, the second MOS transistor M2, and the third MOS transistor M3, to increase the gate-source voltage of the first MOS transistor M1, the second MOS transistor M2, and the third MOS transistor M3. The drain of the fourth MOS transistor M4 is connected to the output terminal of the LDO, allowing the common mode voltage VCM to input into the drain of the fourth MOS transistor M4. The source of the fourth MOS transistor M4 is connected to the drain of the twelfth MOS transistor M12, the source of the eighth MOS transistor M8, and one end of the first capacitor C1. The drain of the fifth MOS transistor M5 is connected to the other end of the first capacitor C1 and the drain of the sixth MOS transistor M6, forming node C. The gate of the fifth MOS transistor M5 is connected to the drain of the eighth MOS transistor M8 and the source of the seventh MOS transistor M7, forming node E. The source of the ninth MOS transistor M9 is connected to the sources of the tenth MOS transistor M10 and the eleventh MOS transistor M11, forming node B. The sources of the tenth MOS transistor M10 and the twelfth MOS transistor M12 are both grounded. The external power supply AVD is respectively input to the sources of the sixth MOS transistor M6, the drain of the seventh MOS transistor M7, the gate of the ninth MOS transistor, and the drain of the tenth MOS transistor. The first external clock signal CLK1 is respectively input to the gates of the tenth MOS transistor M9, the eleventh MOS transistor M11, and the twelfth MOS transistor M12. The second external clock signal CLK2 is respectively input to the gates of the seventh MOS transistor M7 and the eighth MOS transistor M8. As a preferred embodiment of the present invention, the first external clock signal CLK1 and the second external clock signal CLK2 have the same frequency but opposite phases, to control the turn-on and turn-off of different MOS transistors.

Now, referring again to FIGS. 3 and 4, the operation process of the gate voltage bootstrap switching circuit of the present invention follows.

When not sampling, the first external clock signal CLK1 is at a high level, while the second external clock signal CLK2 is at a low level. At this point, the twelfth MOS transistor M12, the eleventh MOS transistor M11, and the seventh MOS transistor M7 are turned on, resulting in the voltages at node D (where MOS transistor M12 is turned on) and node B (where MOS transistor M11 is turned on) being at ground level (GND). The voltage at node E is at the supply voltage AVD (with MOS transistor M7 turned on). The ninth MOS transistor M9 is turned on, and the voltage at node A is equal to ground level (GND) (through MOS transistor M9 and MOS transistor M11 to ground). Consequently, the sixth MOS transistor M6 is turned on, resulting in the voltage at node C being equal to the supply voltage AVD. At this point, the voltage at the upper plate of the first capacitor C1 is AVD (the voltage at node C), while the voltage at the lower plate is GND (the voltage at node D).

During sampling, the first external clock signal CLK1 is at a low level, and the second external clock signal CLK2 is at a high level. At this point, the eighth MOS transistor M8 and the tenth MOS transistor M10 are turned on, causing the voltage at node B to be equal to the supply voltage AVD. The MOS transistor M8 charges the lower plate of the first capacitor C1, causing the voltage at node E to start decreasing. When the voltage at node E drops sufficiently low, the fifth MOS transistor M5 turns on. At this time, the voltage at node A is approximately equal to the voltage at node C, which is the supply voltage AVD. This causes the fourth MOS transistor M4 to turn on, gradually raising the voltage at node D to the common mode voltage VCM. Because the voltage across the first capacitor C1 cannot change abruptly, the voltage at node C changes to VCM+AVD. Since the fifth MOS transistor M5 is turned on, nodes C and A are at the same potential. Therefore, the voltage at node A during the sampling moment is equal to VCM+AVD. The voltage at node A is directly input to the gates of the first MOS transistor M1, the second MOS transistor M2, and the third MOS transistor M3, thereby providing them with a sufficiently large gate-source voltage VGS. In such a way, the impedance nonlinearity issues caused by different inputs to the various switching MOS transistors in the gate voltage bootstrap switching circuit are eliminated.

Additionally, in the gate voltage bootstrap circuit of the present invention, the on-resistance Ron of the second MOS transistor M2 is given by:

$$Ron = \frac{1}{\mu_n C_{ox}\left(\frac{W}{L}\right)_2 (VGS - Vth)},$$

$$Ron = \frac{1}{\mu_n C_{ox}\left(\frac{W}{L}\right)_2 (AVD - Vth)};$$

where un represents a carrier mobility of the N-type MOS transistor, $C_{ox}$ represents a unit capacitance of the gate oxide layer, $$\left(\frac{W}{L}\right)_2$$

represents a width-to-length ratio of the second MOS transistor M2, and Vth represents a threshold voltage of the N-type MOS transistor.

As mentioned above, the gate voltage bootstrap circuit of the present invention provides a sufficiently large gate-source voltage VGS, where VGS=AVD. Furthermore, as shown in the above equation, the on-resistance Ron of the second MOS transistor M2 is significantly lower than the on-resistance mentioned in the background, thus minimizing the impedance of the first MOS transistor M1, the second MOS transistor M2, and the third MOS transistor M3, thereby ensuring the conversion speed of the ADC. The arrangement of the first MOS transistor M1 and the third MOS transistor M3 allows the common-mode voltage VCM to quickly charge the capacitor arrays during sampling, thereby further improving the conversion speed of the ADC.

In the operational process of the gate voltage bootstrap circuit of the present invention, the sixth MOS transistor M6 and the twelfth MOS transistor M12 are primarily used for charging and discharging the first capacitor C1 during non-sampling periods (specifically, the first capacitor C1 is charged when the sixth MOS transistor M6 is turned on, and is discharged when the twelfth MOS transistor M12 is turned on). Therefore, the sizes of the MOS transistors do not need to be too large, as long as they are sufficient to charge the upper plate of the first capacitor C1 to the supply voltage AVD and discharge the lower plate to ground level (GND) during non-sampling periods. The fourth MOS transistor M4 is mainly used for charging the lower plate of the first capacitor C1 to the common-mode voltage VCM during the relatively short sampling period, so the size of the fourth MOS transistor M4 needs to be appropriately increased. In this invention, the width-to-length ratio of the fourth MOS transistor M4 is set to be greater than 60, with specific values adjustable based on the actual applications.

Additionally, in this invention, the first capacitor C1 serves as a bootstrap capacitor, with its parasitic capacitance to ground primarily arising from the MOS transistors connected to its upper and lower plates. This allows for an appropriate increase in the capacitance value of the first capacitor C1 to improve the accuracy of the entire bootstrap switching circuit. Therefore, in this invention, the capacitance value of the first capacitor C1 is set to be greater than 1 pF, with specific values adjustable according to the actual applications.

The above-mentioned embodiments only represent several embodiments of the present invention, and the descriptions thereof are relatively specific and detailed, but should not be construed as limiting the scope of the patent invention. It should be pointed out that for those skilled in the art, several modifications and improvements can be made without departing from the concept of the present invention, which all belong to the protection scope of the present invention. Therefore, the scope of protection of the patent of the present invention shall be subject to the appended claims.

What is claimed is:

1. A gate voltage bootstrap switching circuit, adapted for a common mode voltage sampling structure, comprising a low dropout regulator (LDO), a first MOS transistor, a second MOS transistor, a third MOS transistor, and a voltage control unit;

wherein a non-inverting input terminal of the LDO is connected to an external reference voltage, an inverting input terminal of the LDO is connected to an output terminal of the LDO which outputs a common mode voltage; a drain of the first MOS transistor and a source of the third MOS transistor are both connected to the output terminal of the LDO, a source of the first MOS transistor is connected to a drain of the second MOS transistor, and a source of the second MOS transistor is connected to a drain of the third MOS transistor; two external capacitor arrays are connected to the source and drain of the second MOS transistor, respectively; the voltage control unit is connected to an external power supply, and further connected to gates of the first, second, and third MOS transistors respectively to input a voltage of the external power supply as a gate-source voltage to the first, second, and third MOS transistors.

2. The gate voltage bootstrap switching circuit according to claim 1, wherein the first, second, and third MOS transistors are all N-type MOS transistors.

3. The gate voltage bootstrap switching circuit according to claim 2, wherein a width-to-length ratio of the first, second, and third MOS transistors is greater than 100.

4. The gate voltage bootstrap switching circuit according to claim 1, wherein the voltage control unit comprises a fourth MOS transistor, a fifth MOS transistor, a sixth MOS transistor, a seventh MOS transistor, an eighth MOS transistor, a ninth MOS transistor, a tenth MOS transistor, an eleventh MOS transistor, a twelfth MOS transistor, and a first capacitor; a gate of the fourth MOS transistor, a gate of the sixth MOS transistor, a source of the fifth MOS transistor, and a drain of the ninth MOS transistor are all connected to a gate of the second MOS transistor; a drain of the fourth MOS transistor is connected to the output terminal of the LDO, a source of the fourth MOS transistor is connected to a drain of the twelfth MOS transistor, a source of the eighth MOS transistor, and one end of the first capacitor; a drain of the fifth MOS transistor is connected to the other end of the first capacitor and a drain of the sixth MOS transistor; a gate of the fifth MOS transistor is connected to a drain of the eighth MOS transistor and a source of the seventh MOS transistor, a source of the ninth MOS transistor is connected to a source of the tenth MOS transistor and a drain of the eleventh MOS transistor, and the sources of the ninth MOS transistor and the tenth MOS transistor are both grounded; the external power supply is connected to a source of the sixth MOS transistor, a drain of the seventh MOS transistor, a gate of the ninth MOS transistor, and a drain of the tenth MOS transistor; a first external clock signal is input to the gates of the tenth MOS transistor, the eleventh MOS transistor, and the twelfth MOS transistor, respectively; and a second external clock signal is input to the gates of the seventh MOS transistor and the eighth MOS transistor, respectively.

5. The gate voltage bootstrap switching circuit according to claim 4, wherein the first external clock signal and the second external clock signal have a same frequency and opposite phases.

6. The gate voltage bootstrap switching circuit according to claim 4, wherein a width-to-length ratio of the fourth MOS transistor is greater than 60.

7. The gate voltage bootstrap switching circuit according to claim 4, wherein a capacitance value of the first capacitor is greater than 1 pF.

* * * * *